(12) United States Patent
Cho

(10) Patent No.: US 7,068,003 B2
(45) Date of Patent: Jun. 27, 2006

(54) SYSTEM TO DETERMINE PROPER WAFER ALIGNMENT

(75) Inventor: Yeon-Ha Cho, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 11/150,120

(22) Filed: Jun. 13, 2005

(65) Prior Publication Data

US 2006/0001395 A1     Jan. 5, 2006

(30) Foreign Application Priority Data

Jun. 30, 2004     (KR) .................. 10-2004-0050175

(51) Int. Cl.
  *B25J 15/02* (2006.01)
(52) U.S. Cl. .................. 318/568.11; 318/568.21; 414/222.01; 414/222.13; 356/399; 356/400
(58) Field of Classification Search .......... 318/568.11, 318/568.21; 414/222.01, 222.13; 356/399, 356/400
  See application file for complete search history.

(56) References Cited

U.S. PATENT DOCUMENTS

| | | | |
|---|---|---|---|
| 4,775,281 A * | 10/1988 | Prentakis | 414/416.03 |
| 5,475,618 A | 12/1995 | Le | |
| 6,126,382 A * | 10/2000 | Scales et al. | 414/754 |
| 6,275,742 B1 * | 8/2001 | Sagues et al. | 700/213 |
| 6,764,713 B1 * | 7/2004 | Wytman | 427/123 |
| 6,800,803 B1 * | 10/2004 | Marumo | 174/35 GC |
| 6,809,802 B1 * | 10/2004 | Tsukamoto et al. | 355/72 |
| 6,870,623 B1 * | 3/2005 | Tanaka et al. | 356/401 |
| 2001/0043514 A1 | 11/2001 | Kita | |
| 2001/0052392 A1 | 12/2001 | Nakamura et al. | |

\* cited by examiner

*Primary Examiner*—Rina Duda
(74) *Attorney, Agent, or Firm*—Volentine Francos & Whitt, PLLC

(57) ABSTRACT

An apparatus for aligning a wafer is provided, which normally senses a flat zone of the wafer by sensors regardless of an external light so that the wafer is aligned in a set mode, in order to increase or maximize production yield. A body has all kinds of drivers. An orient chuck is provided to protrude to an upper portion of the body for rotating the wafer; a guide plate ascending and descending to slide a circumference surface of the wafer so that a center of the wafer is located on the orient chuck. A plurality of sensors sense a flat zone of the wafer being rotated on the orient chuck. A wafer carrier cassette is formed at an upper portion of the orient chuck in order to load the wafer aligned in one direction by the sensors and the orient chuck, and is supported by a plurality of frames formed at respective corners of the body. A panel wall encloses a circumference of the frame at peripheries of the orient chuck and sensors between the wafer carrier cassette and the body, and intercepts an external light to be incident to the sensors.

14 Claims, 4 Drawing Sheets

SYSTEM TO DETERMINE PROPER WAFER ALIGNMENT

BACKGROUND OF THE INVENTION

1. Technical Field

The present invention generally relates to a semiconductor device manufacturing apparatus. More particularly, the present invention relates to a system used to determine proper alignment of a wafer loaded into an ion implantation device.

A claim of priority is made to Korean Patent Application No. 2004-50175, filed Jun. 30, 2004, the disclosure of which is hereby incorporated herein by reference in its entirety.

2. Discussion of Related Art

Generally, to manufacture a semiconductor device, various unit processes are performed on a semiconductor wafer. Among such unit processes is an ion implantation process, which implants impurities into a semiconductor wafer to change electric characteristics of the semiconductor wafer.

The ion implantation process is a process of implanting a P type impurity such as boron, aluminum, and indium, or implanting an N type impurity such as antimony, phosphor, and arsenic into a semiconductor crystalline structure in order to obtain desired conductive and resistive elements.

Such an ion implantation process can adjust an impurity concentration in a semiconductor wafer to a range of $10E14 \sim 10E18$ atoms/cm$^3$. It is also easier to adjust the impurity and depth concentration with the ion implantation process than a diffusion process. Furthermore, since the ion implantation process can restrictively implant ions into local regions, the ion implantation process has a wider use. U.S. Pat. No. 5,475,618, for example, discloses an ion implantation device to perform the aforementioned ion implantation process.

FIG. 1 is a perspective view of a conventional ion implantation apparatus.

As shown in FIG. 1, the conventional ion implantation device includes an ion implanter 10 and a wafer loading mechanism 30. Wafer loading mechanism 30 positions a wafer, and ion implanter 10 implants impurity ions into the wafer.

Wafer loading mechanism 30 includes a loading station 32, an unloading station 33, and a process chamber 31. Loading station 32 and unloading station 33 respectively loads and unloads the wafer for an ion implantation process. After the wafer is loaded into a predetermined position in process chamber 31, ion implantation is performed under vacuum pressure or atmospheric pressure.

The wafer in process chamber 31 must be aligned in a specific direction, so that impurity ions can be implanted into the wafer at a precise angle by ion implanter 10. Accordingly, an apparatus to align and load the wafer in process chamber 31 is required. The aligned and loaded wafer is transferred to the ion implantation apparatus by means of a robot arm.

FIG. 2 is a perspective view of a conventional wafer alignment apparatus.

As shown in FIG. 2, the conventional wafer alignment apparatus includes a body 100, an alignment chuck 110, a guide plate 120, a plurality of sensors 130, and a wafer carrier cassette 150. Body 100 includes drivers such as a motor 102 and a pulley 104. Alignment chuck 110 protrudes at an upper center portion of body 100 to rotate a wafer. Guide plate 120 moves in a vertical direction to accurately locate a center of the wafer. In other words, after a wafer is positioned on alignment chuck 110, guide plate 120, which circumferentially surrounds alignment chuck 110, then moves up to properly seat the wafer in guide plate 120. The plurality of sensors 130 detect a flat zone of the wafer. Wafer carrier cassette 150 is supported by a plurality of frames 140 formed at respective corners of body 100. The wafer aligned by the plurality of sensors 130 and alignment chuck 110 is loaded onto wafer carrier cassette 150 in a specific direction. Although not shown, the conventional wafer alignment apparatus further includes a control section to control the drivers using a signal detected by the plurality of sensors 130.

Alignment chuck 110, guide plate 120, and the plurality of sensors 130 are disposed between body 100 and wafer carrier cassette 150. Alignment chuck 110, guide plate 120, and the plurality of sensors 130 are exposed to the outside.

Moreover, when a wafer is loaded by means of a robot arm, alignment chuck 110 adsorbs the wafer by suction and rotates it. At this time, alignment chuck 110 cannot move vertically.

Guide plate 120 moves vertically between alignment chuck 110 and body 100 when a wafer is loaded and unloaded from alignment chuck 110. However, guide plate 120 does not rotate.

Each of the plurality of sensors 130 includes a light emitting section to emit light, and a light receiving section to receive the light reflected by a wafer. The plurality of sensors 130 are fixed and located between alignment chuck 110 and guide plate 120. Preferably, a first sensor 130a and a second sensor 130b are formed to face each other centered about alignment chuck 110. When the wafer is loaded and rotated on alignment chuck 110, sensors 130a and 130b detect a flat zone at a side of the wafer's edge, which assists to align the wafer to a set location.

That is, alignment chuck 110 rotates a wafer in a first direction when first sensor 130a detects a flat zone of the wafer. Alignment chuck 110 stops the rotation when a second sensor 130b detects the flat zone of the wafer. Then alignment chuck 110 rotates the wafer in a second direction and stops the rotation when first sensor 130a again detects the flat zone of the wafer. By this method, the wafer is accurately arranged on alignment chuck 110 in either one of a predetermined programmed A mode or B mode.

However, if second sensor 130b fails to detect the flat zone of the wafer due to an interference from light from a source other than the light emitting section, alignment chuck 110 rotates the wafer by 360 degrees until first sensor 130a again senses the flat zone of the wafer. Accordingly, the wafer is inaccurately arranged on alignment chuck 110, and thus inaccurately loaded into an ion implantation apparatus.

Wafer carrier cassette 150 is a location to which the wafer aligned by alignment chuck 110 is moved by a robot arm to be temporarily stored. A plurality of wafers may be loaded onto wafer carrier cassette 150. The wafers loaded onto wafer carrier cassette 150 are moved to another wafer carrier cassette to be moved to a wafer loading station of an ion implantation apparatus.

Therefore, the conventional wafer alignment apparatus aligns the flat zone of the wafer using the plurality of sensors 130 and alignment chuck 110, and supplies the aligned wafer to ion implantation device by a robot arm.

However, as described above, the conventional wafer alignment apparatus has the following problems.

In the conventional wafer alignment apparatus, when external light emits sensor 130, sensor 130 cannot accurately detect the flat zone of the wafer.

Therefore, it would be desirable to provide an apparatus for aligning a wafer, which normally detects a flat zone of the wafer by sensors.

SUMMARY OF THE INVENTION

In an aspect of the present invention there is a system to determine proper alignment of a wafer in an ion implantation apparatus having a body containing drivers, an alignment chuck disposed above the body, and adapted to rotate a wafer, a guide plate circumferentially surrounding the alignment chuck, and adapted to move vertically to seat the wafer on the alignment chuck, a plurality of sensors adapted to detect a flat zone of the wafer, and to align the wafer, and a panel wall enclosing the alignment chuck, the guide chuck, and the plurality of sensors on at least three sides to block external light from reaching the sensors.

In another aspect of the present invention there is a system to determine proper alignment of a wafer in an ion implantation apparatus having a body containing drivers, an alignment chuck disposed above the body, and adapted to rotate a wafer, a guide plate circumferentially surrounding the alignment chuck, and adapted to move vertically to seat the wafer on the alignment chuck, a light emitting section to emit light onto the wafer, and a light receiving section to receive the light reflected off the wafer, and a panel wall surrounds the alignment chuck, chuck guide, and the light emitting and receiving sections on four sides, and a door or a hole is disposed at one side of the panel wall so a robot arm can load and unload the wafer to the alignment chuck, or to move guide plate in and out.

Another aspect of the present invention there is a system to determine proper alignment of a wafer in an ion implantation apparatus having a body containing drivers, an alignment chuck disposed above the body, and adapted to rotate a wafer, a guide plate circumferentially surrounding the alignment chuck, and adapted to move vertically to seat the wafer on the alignment chuck, a light emitting section to irradiate light onto the wafer, and a light receiving section to receive the light reflected off the wafer, and a panel wall surrounds the alignment chuck, chuck guide, and the light emitting and receiving sections on four sides, and a door or a hole is disposed at one side of the panel wall so a robot arm can load and unload the wafer to the alignment chuck, or to move guide plate in and out.

BRIEF DESCRIPTION OF THE DRAWINGS

The above and other aspects of the present invention will become more apparent to those of ordinary skill in the art by the detailed description of the preferred embodiments with reference to the attached drawings in which.

DETAILED DESCRIPTION OF THE INVENTION

The present invention now will be described more fully hereinafter with reference to the accompanying drawings, in which embodiments of the parent invention are shown. However, the present invention should not be construed as limited to the embodiments set forth herein. Rather, these embodiments are provided as working examples. Also, in the description to follow, like numbers refer to like elements.

Figure 1:
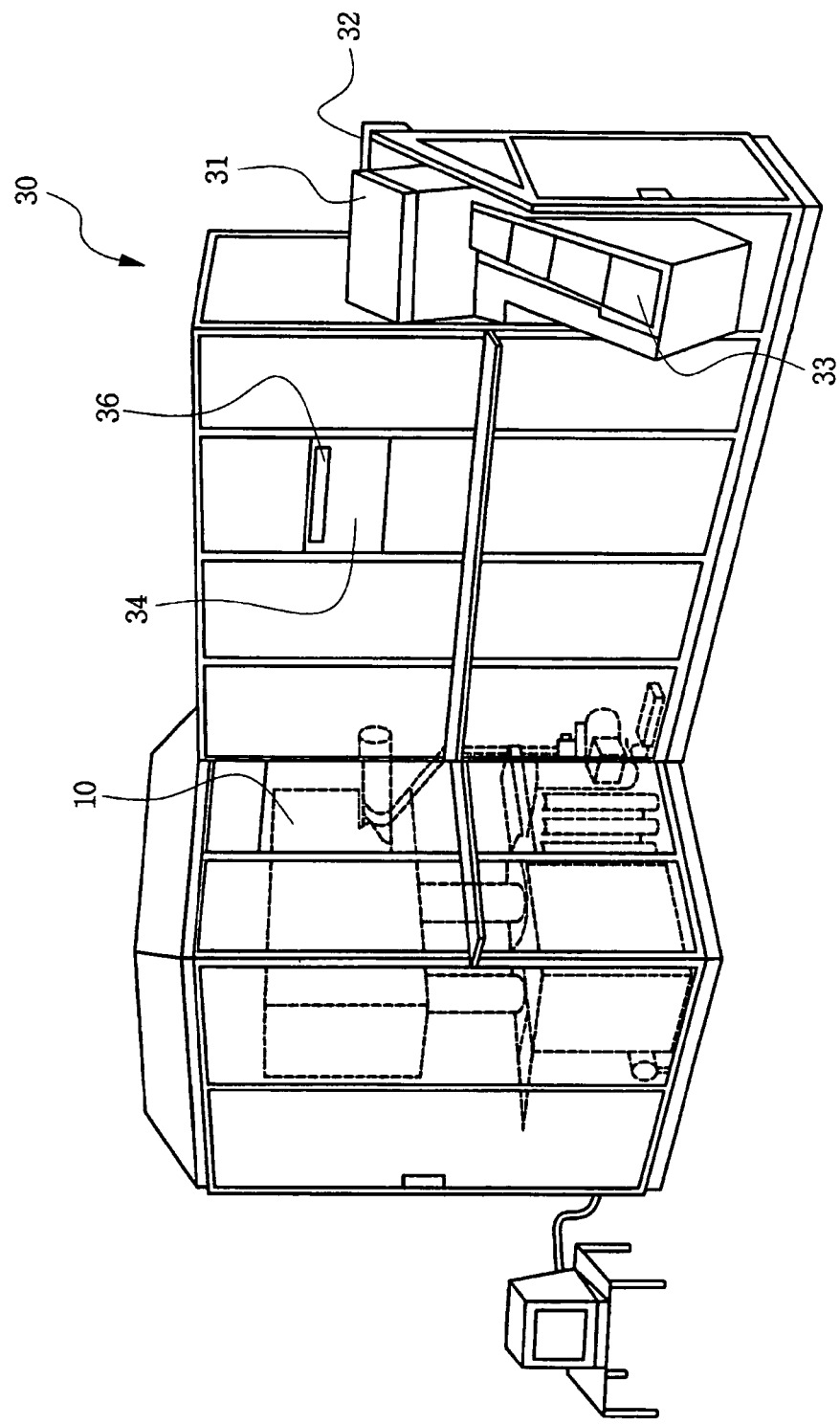
FIG. 1 is a perspective view of a conventional ion implantation apparatus.
Figure 2:
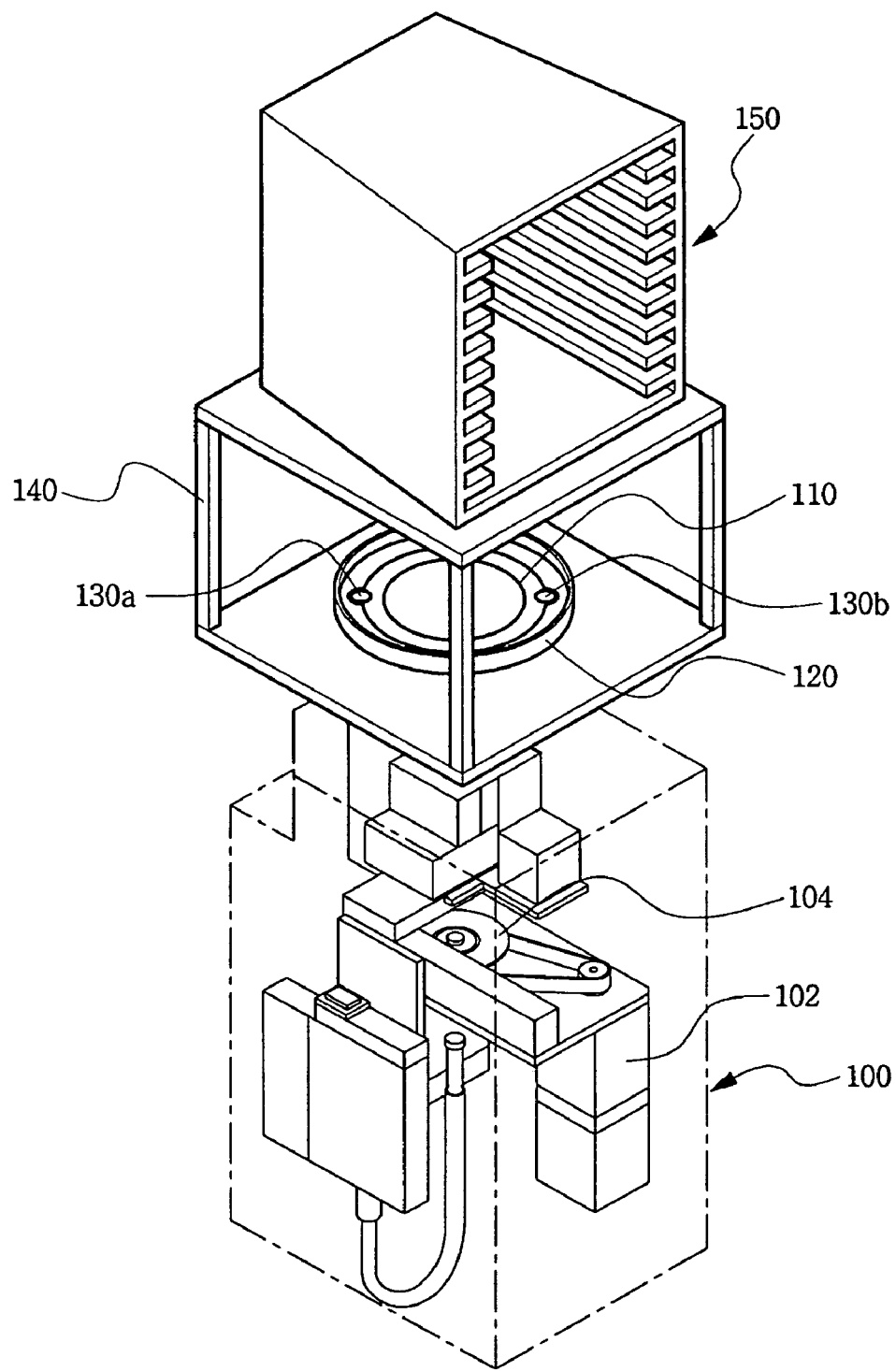
FIG. 2 is a perspective view of a conventional wafer alignment apparatus.
Figure 3:
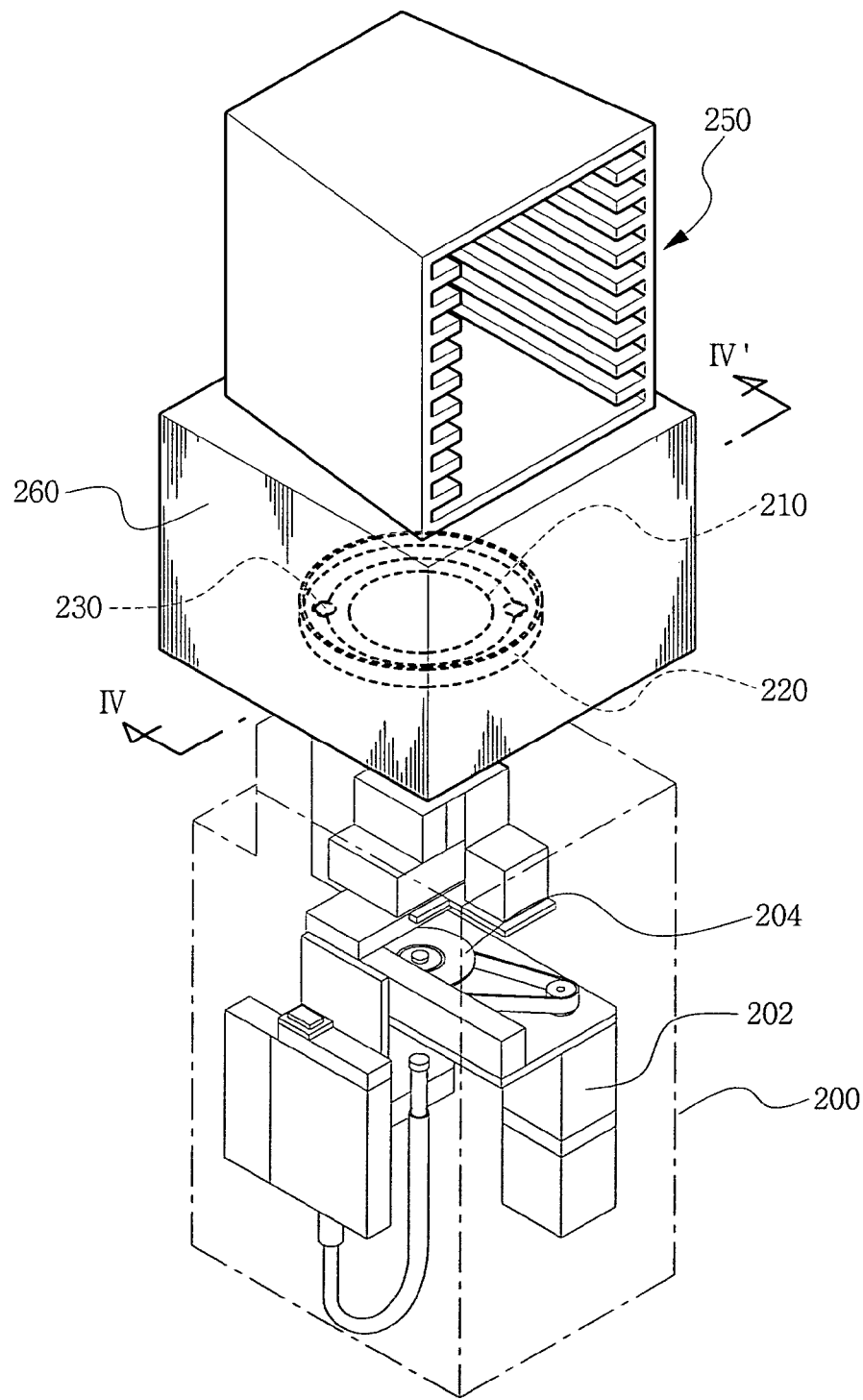
FIG. 3 is a perspective view illustrating an apparatus to align a wafer according to an embodiment of the present invention.
Figure 4:
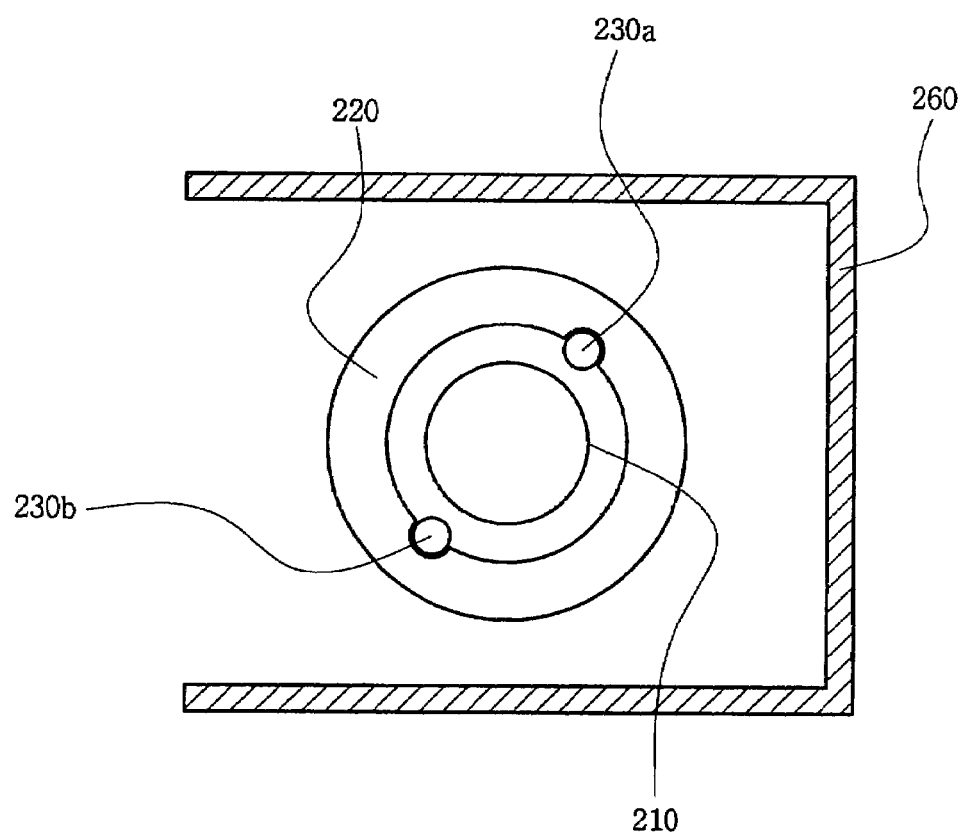
FIG. 4 is a cross-sectional view schematically illustrating a sensor and a panel wall taken along line IV–IV' in FIG. 3.

FIG. 3 is a perspective view illustrating an apparatus to align a wafer according to an embodiment of the present invention. FIG. 4 is a cross-sectional view schematically illustrating sensors and a panel wall taken along line IV–IV' in FIG. 3.

As shown in FIG. 3 and FIG. 4, the apparatus includes a body 200, an alignment chuck 210, a guide plate 220, a plurality of sensors 230, e.g., a first sensor 230a and a second sensor 230b, a wafer carrier cassette 250, and a panel wall 260. Body 200 includes drivers such as a motor 202 and a pulley 204.

Alignment chuck 210 protrudes to an upper center portion of body 200 to rotate a wafer. Guide plate 220 moves in a vertical direction to accurately locate a center of the wafer. In other words, after a wafer is positioned on alignment chuck 210, guide plate 220, which circumferentially surrounds alignment chuck 210, then moves up to properly seat the wafer in guide plate 220.

Sensors 230 detect a flat zone of a wafer rotated on alignment chuck 210. Wafer carrier cassette 250 is located above alignment chuck 210 to load the specifically aligned wafer.

Panel wall 260 encloses alignment chuck 210, guide plate 220, and the plurality of sensors 230 between wafer carrier cassette 250 and body 200. Panel wall 260 blocks external light, which may be falsely detected by the plurality of sensors 230. Although not shown, the apparatus further includes a control section to control the drivers using a wafer sensing signal provided by sensors 230.

Panel wall 260 is formed of an opaque metal such as a luminum or a plastic material such as acrylic or polyester, and functions to block external light. As shown in FIG. 4, one side of panel wall 260 preferably is left open to allow a robot arm to load and unload a wafer to and from alignment chuck 210, or to move guide plate 220 in and out. The open side may also be closed by a door or may be covered with a wall having an opening to allow a wafer to be loaded or unloaded. For example, the door or the opening may be always open, or the door or opening may be opened and closed according to a control signal from the control section.

Further, when the wafer is loaded by the robot arm, after alignment chuck 210 is evacuated, and the wafer adsorbed by suction and rotated, alignment chuck 210 aligns the wafer by a control signal from the control section in response to a wafer sensing signal from sensors 230. Guide plate 220 includes a stepped portion. The stepped portion of guide plate 220 has a slanted surface. The peripheral surface of the wafer slides along the slanted surface so that a center of the wafer is moved to a location corresponding to a center of alignment chuck 210. The stepped portion has a radius greater than a radius of the wafer. Guide plate 220 moves vertically between alignment chuck 210 and body 200 when a wafer is loaded and unloaded from alignment chuck 210. However, guide plate 220 does not rotate.

Furthermore, each of the plurality of sensors 230 can detect the flat zone of the wafer in a contact or non-contact manner. The non-contact manner is more preferable. The non-contact photo sensors are fixed between alignment chuck 210 and guide plate 220, and detect a flat zone of the wafer. The non-contact photo sensor is includes of a light emitting section to emit visible or infrared lights, and a light receiving section to receive the visible or the infrared light reflected by the wafer. The light emitting section and the light receiving section of sensors 230 are positioned above or below the wafer in a same direction. Further, the light emitting section and the light receiving section may be formed to face each other at upper and lower sides of the wafer around an edge of alignment chuck 210.

Wafer carrier cassette 250 is a location in which a wafer aligned by alignment chuck 210 is moved by a robot arm to be temporarily stored. The loaded wafers are moved to another wafer carrier cassette 250 to be moved to a wafer loading station of an ion implantation device.

Accordingly, the apparatus to align a wafer includes a panel wall 260. Panel wall 260 encloses alignment chuck 210 and the plurality of sensors 230 between wafer carrier cassette 250 and body 200, and blocks external light from being incident on the plurality of sensors 230. Thus, panel wall 260 prevents the plurality of sensors 230 from unnecessarily detecting external light.

An operation of the apparatus for aligning a wafer will now be described.

First, when a wafer is loaded onto an upper portion of an alignment chuck 210 by means of a robot arm, a guide plate 220 moves above alignment chuck 210 to hold the wafer in place. The wafer slides into guide plate 220 and a center of the wafer is positioned to correspond to a center of the alignment chuck 210.

Next, guide plate 220 slowly moves down so that the wafer is properly seated on alignment chuck 210. Alignment chuck 210 evacuates and adsorbs the wafer by suction. A plurality of sensors 230 detect the position of the wafer on alignment chuck 210, and output a wafer sensing signal to a control section. Moreover, the control section controls the driver to rotate alignment chuck 210 according to a set wafer alignment mode so that a flat zone of the wafer is positioned at a location corresponding to a specific side of the plurality of sensors 230.

Then, when a first sensor 230a detects a flat zone of the wafer, alignment chuck 210 rotates the wafer 180° in a first direction. When a second side sensor 203b detects the flat zone of the wafer, the rotation of alignment chuck 210 is stopped. At this time, because the plurality of sensors 230 are not exposed to external light, errors in alignment are prevented.

Thereafter, alignment chuck 210 rotates the wafer 180° in a second direction. When first sensor 230a again detects the flat zone of the wafer, the rotation of alignment chuck 210 is stopped. Accordingly, a flat zone direction of the wafer is aligned in two modes having a mode A and a mode B according to the positions of sensors 230.

What is claimed is:

1. A system to determine proper alignment of a wafer in an ion implantation apparatus, comprising:
    a body containing drivers;
    an alignment chuck disposed above the body, and adapted to rotate a wafer;
    a guide plate circumferentially surrounding the alignment chuck, and adapted to move vertically to seat the wafer on the alignment chuck;
    a plurality of sensors adapted to detect a flat zone of the wafer, and to align the wafer; and
    a panel wall enclosing the alignment chuck, the guide chuck, and the plurality of sensors on at least three sides to block external light from reaching the sensors.

2. The apparatus according to claim 1, wherein the panel wall comprises an opaque metal or a plastic material.

3. The apparatus according to claim 1, wherein one side of the panel wall is open so that a robot arm can load and unload the wafer to the alignment chuck, or to move guide plate in and out.

4. The apparatus according to claim 1, wherein the panel wall surrounds the alignment chuck, chuck guide, and sensors on four sides, and a door or a hole is disposed at one side of the panel wall so a robot arm can load and unload the wafer to the alignment chuck, or to move guide plate in and out.

5. The apparatus according to claim 1, wherein the plurality of sensors detects the flat zone of the wafer in a non-contact manner.

6. The apparatus according to claim 5, wherein the plurality of sensors includes a photo sensor.

7. The apparatus according to claim 6, wherein the photo sensor includes a light emitting section to emit light onto the wafer, and a light receiving section to receive the light reflected from the wafer.

8. The apparatus according to claim 1, further comprising a wafer carrier disposed on the wafer aligning apparatus to load the aligned wafer.

9. The apparatus according to claim 1, wherein the drivers are a motor and a pulley.

10. A system to determine proper alignment of a wafer in an ion implantation apparatus, comprising:
    a body containing drivers;
    an alignment chuck disposed above the body, and adapted to rotate a wafer;
    a guide plate circumferentially surrounding the alignment chuck, and adapted to move vertically to seat the wafer on the alignment chuck;
    a light emitting section to emit light onto the wafer, and a light receiving section to receive the light reflected off the wafer; and
    a panel wall surrounds the alignment chuck, chuck guide, and the light emitting and receiving sections on four sides, and a door or a hole is disposed at one side of the panel wall so a robot arm can load and unload the wafer to the alignment chuck, or to move guide plate in and out;
    wherein the light emitting and receiving sections detects the flat zone of the wafer in a non-contact manner.

11. A system to determine proper alignment of a wafer in an ion implantation apparatus, comprising:
    a body containing drivers;
    an alignment chuck disposed above the body, and adapted to rotate a wafer;
    a guide plate circumferentially surrounding the alignment chuck, and adapted to move vertically to seat the wafer on the alignment chuck;
    a light emitting section to irradiate light onto the wafer, and a light receiving section to receive the light reflected off the wafer; and
    a panel wall surrounds the alignment chuck, chuck guide, and the light emitting and receiving sections on four sides, and a door or a hole is disposed at one side of the panel wall so a robot arm can load and unload the wafer to the alignment chuck, or to move guide plate in and out.

12. The apparatus according to claim 11, wherein the panel wall comprises an opaque metal or a plastic material.

13. The apparatus according to claim 11, further comprising a wafer carrier disposed on the wafer aligning apparatus to load the aligned wafer.

14. The apparatus according to claim 11, wherein the drivers are a motor and a pulley.

* * * * *